(12) United States Patent
Gan et al.

(10) Patent No.: US 7,508,893 B1
(45) Date of Patent: Mar. 24, 2009

(54) INTEGRATED CIRCUITS AND METHODS WITH STATISTICS-BASED INPUT DATA SIGNAL SAMPLE TIMING

(75) Inventors: Zhonghai Gan, Shanghai (CN); Yefei Sun, Shanghai (CN)

(73) Assignee: Integrated Device Technology, Inc., Santa Clara, CA (US)

( * ) Notice: Subject to any disclaimer, the term of this patent is extended or adjusted under 35 U.S.C. 154(b) by 580 days.

(21) Appl. No.: 11/092,032

(22) Filed: Mar. 29, 2005

Related U.S. Application Data

(60) Provisional application No. 60/577,408, filed on Jun. 4, 2004.

(51) Int. Cl.
*H04L 7/00* (2006.01)
(52) U.S. Cl. ...................................... 375/355
(58) Field of Classification Search ................... 375/355
See application file for complete search history.

(56) References Cited

U.S. PATENT DOCUMENTS

| | | | | |
|---|---|---|---|---|
| 6,584,163 | B1 * | 6/2003 | Myers et al. ................. 375/360 |
| 6,611,219 | B1 * | 8/2003 | Lee et al. ..................... 341/141 |
| 6,628,736 | B1 * | 9/2003 | Legrand et al. .............. 375/355 |
| 7,292,662 | B2 * | 11/2007 | Gregorius .................... 375/350 |
| 2001/0018751 | A1 * | 8/2001 | Gresham ..................... 713/401 |
| 2002/0085656 | A1 * | 7/2002 | Lee et al. ..................... 375/355 |

\* cited by examiner

*Primary Examiner*—Shuwang Liu
*Assistant Examiner*—David Huang
(74) *Attorney, Agent, or Firm*—Myers Bigel Sibley & Sajovec P.A.

(57) ABSTRACT

An integrated circuit device includes a data input configured to receive a data signal and a clock input configured to receive a clock signal associated with the data signal. The device further includes a sample timing circuit coupled to the clock input and the data input and configured to generate a statistical measure of timing of the data signal and to identify a sample timing for the data signal based on the generated statistical measure. The sample timing circuit may be configured to generate samples of the data signal at a rate higher than a rate of the clock signal, and to generate the statistical measure of timing of the data signal from the data signal samples.

2 Claims, 5 Drawing Sheets

INTEGRATED CIRCUITS AND METHODS WITH STATISTICS-BASED INPUT DATA SIGNAL SAMPLE TIMING

RELATED APPLICATION

The present application claims priority from U.S. Provisional Application Ser. No. 60/577,408, entitled Apparatus and Methods for Data Alignment for a High-Speed Data Bus, filed Jun. 4, 2004, the disclosure of which is incorporated by reference herein in its entirety.

BACKGROUND OF THE INVENTION

The present invention relates to integrated circuit devices and methods of operation thereof, and more particularly, to integrated circuits and methods for receiving data.

As the speed of data busses used in computing, packet processing and other digital electronics applications increases, problems arising from skew and/or jitter of various signals tend to increase. For example, in synchronous data bus applications, skew and/or jitter of bits of a data bus and/or between bits of the data bus and the bus clock signal can cause errors in transferring data between a source device and a destination device coupled by the bus. Skew may be attributable to differences between data lines within the source device chip, between data lines within the source device packaging (e.g., lead frame), between data lines of the bus itself, between data lines of the destination device packaging, and/or between data lines in the destination device chip. Jitter may be attributable to noise sources coupling into the data lines.

Skew and/or jitter can be reduced by careful design of the devices and/or interconnecting wiring. However, this may require multiple IC and/or board design iterations and/or may preclude the use of IC and/or board layouts that may be desirable for other functional reasons. Moreover, the amount of freedom in varying an IC design tends to be limited, as it is generally desirable that a particular IC be usable in a variety of different board layouts. Accordingly there is a need for integrated circuits and operating methods which can provide improved design flexibility and efficiency while reducing signal jitter and skew effects.

SUMMARY OF THE INVENTION

In some embodiments of the present invention, an integrated circuit device includes a data input configured to receive a data signal and a clock input configured to receive a clock signal associated with the data signal. The device further includes a sample timing circuit coupled to the clock input and the data input and configured to generate a statistical measure of timing of the data signal and to identify a sample timing for the data signal based on the generated statistical measure. The sample timing circuit may be configured to generate samples of the data signal at a rate higher than a rate of the clock signal, and to generate the statistical measure of timing of the data signal from the data signal samples.

In further embodiments, the sample timing circuit includes a multiphase clock generator configured to generate a plurality of phased clock signals responsive to the clock signal. A sample timing control signal generator is configured to generate samples of the data signal responsive to respective ones of the plurality of phased clock signals, to generate a statistical measure of transitions in the data signal from the generated samples and to generate a sample timing control signal responsive to the statistical measure. The sample timing control signal generator may include a plurality of latches, respective ones of which are configured to store samples of the data signal responsive to respective ones of the phased clock signals, and a plurality of transition detectors, respective ones of which receive respective pairs of the stored samples corresponding to respective pairs of consecutive edges of the phased clock signals and responsively generate respective transition indication signals. The sample timing control signal generator may further include a plurality of counters that generate respective counts responsive to respective ones of the transition indication signals, and a count analyzer that generates the sample timing control signal responsive to the counts.

The count analyzer may be configured, for example, to identify extrema among the counts and to generate the sample timing control signal based on the extrema. The count analyzer may generate the sample timing control signal responsive to the counters accumulating sample transition information for a plurality of cycles of the clock signal.

According to additional embodiments, the multiphase clock generator includes a tapped delay line coupled to the clock input. Respective ones of the plurality of latches have their inputs coupled to respective taps of the tapped delay line. The multiphase clock generator may include a phase- or delay-locked loop that includes the tapped delay line.

In further embodiments, the count analyzer considers transition information from a first number of the plurality of latches to generate the sample timing control signal in a first mode of operation, and the count analyzer considers information from a second number of the plurality of latches to generate the sample timing control signal in a second mode of operation. The first mode of operation may be an initialization mode, the second mode of operation may be a tracking mode, and the first number may be less than the second number.

In certain embodiments, the sample timing control signal includes a clock selection signal, and the sample timing circuit further includes a clock selector coupled to the multiphase clock generator and configured to select one of the plurality of phased clock signals responsive to the clock selection signal. The device may further include a clocked data input circuit coupled to the data input and configured to sample the data signal responsive to the selected phased clock signal.

In method embodiments of the present invention, a data signal is sampled by generating a statistical measure of timing of the data signal responsive to a clock signal associated with the data signal, identifying a sample timing for the data signal based on the generated statistical measure and sampling the data signal using the identified sample timing. Generating a statistical measure may include generating samples of the data signal at a rate higher than a rate of the clock signal, and generating the statistical measure of timing of the data signal from the data signal samples.

Generating samples of the data signal at a rate higher than a rate of the clock signal may include generating a plurality of phased clock signals responsive to the clock signal, and generating the samples of the data signal responsive to respective ones of the plurality of phased clock signals. Generating the statistical measure of timing of the data signal from the data signal samples may include generating a statistical measure of transitions in the data signal from the generated samples. Identifying a sample timing may include generating a sample timing control signal, e.g., a clock selection signal, responsive to the statistical measure.

In further embodiments, generating the samples of the data signal responsive to respective ones of the plurality of phased clock signals includes providing the plurality of clock signals to respective ones of a plurality of latches. Generating a statistical measure of transitions in the data signal from the generated samples includes logically combining respective pairs of the stored samples corresponding to respective pairs of consecutive edges of the phased clock signals to generate respective transition indication signals, and generating respective counts responsive to respective ones of the transition indication signals. Generating a sample timing control signal responsive to the statistical measure includes generating the sample timing control signal responsive to the counts.

DETAILED DESCRIPTION OF EXEMPLARY EMBODIMENTS

Figure 1:
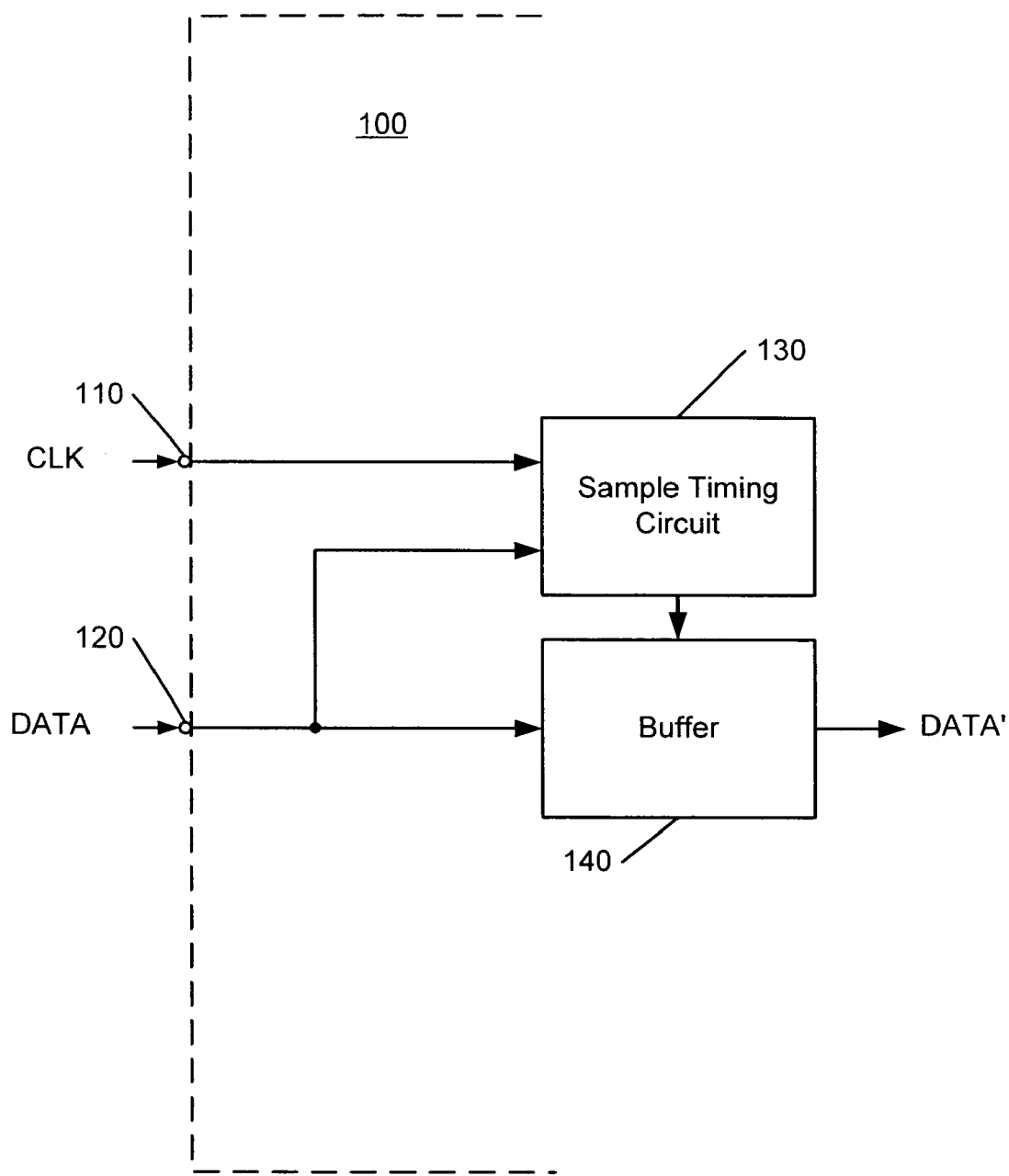
FIG. 1 is a schematic diagram illustrating a data input circuit for an integrated circuit device according to some embodiments of the present invention.

The present invention will now be described more fully herein with reference to the accompanying drawings, in which exemplary embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals or other reference designators refer to like elements throughout. Signals may also be synchronized and/or undergo minor Boolean operations (e.g., inversion) without being considered different signals.

It will be understood that when an element is referred to as being "connected" or "coupled" to another element, it can be directly connected or coupled to the other element or intervening elements may be present. Furthermore, "connected" or "coupled" as used herein may include wirelessly connected or coupled.

The terminology used herein is for the purpose of describing particular embodiments only and is not intended to be limiting of the invention. As used herein, the singular forms "a", "an" and "the" are intended to include the plural forms as well, unless expressly stated otherwise. It will be further understood that the terms "includes," "includes," "including" and/or "including," when used in this specification, specify the presence of stated features, integers, steps, operations, elements, and/or components, but do not preclude the presence or addition of one or more other features, integers, steps, operations, elements, components, and/or groups thereof. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present specification and will not be interpreted in an idealized or overly formal sense unless expressly so defined herein.

It will be understood that although the terms first and second are used herein to describe various elements, these elements should not be limited by these terms. These terms are only used to distinguish one element from another element. Thus, a first item could be termed a second item, and similarly, a second item may be termed a first item without departing from the teachings of the present invention. As used herein, the term "and/or" includes any and all combinations of one or more of the associated listed items. The symbol "/" may also used as a shorthand notation for "and/or".

FIG. 1 illustrates an integrated circuit device 100 according to some embodiments of the present invention. The device 100 includes a clock input 110 and a data input 120, e.g., pins or other terminals configured to be connected to signal lines or other conductors that electrically coupled the device 100 to one or more other devices. The data input 120 may, for example, be configured to be connected to a data bus that carries a data signal DATA, and the clock input 110 may be configured to be connected to a clock signal line that carries a data clock signal CLK associated with the data signal DATA.

The device 100 further includes a sample timing circuit 130 that is coupled to the clock input 110 and to the data input 120. The sample timing circuit 130 is configured to generate a statistical measure of timing of the data signal DATA with respect to the clock signal CLK, and to identify a sample timing for the data signal DATA based on the generated statistical measure. For example, as shown, the sample timing circuit 130 may control sample timing of a sampling circuit, here shown as a data buffer 140 that samples the data signal DATA at the data input 120 to produce a data signal DATA'. It will be appreciated that other types of sampling circuits may be used with the present invention.

Figure 2:
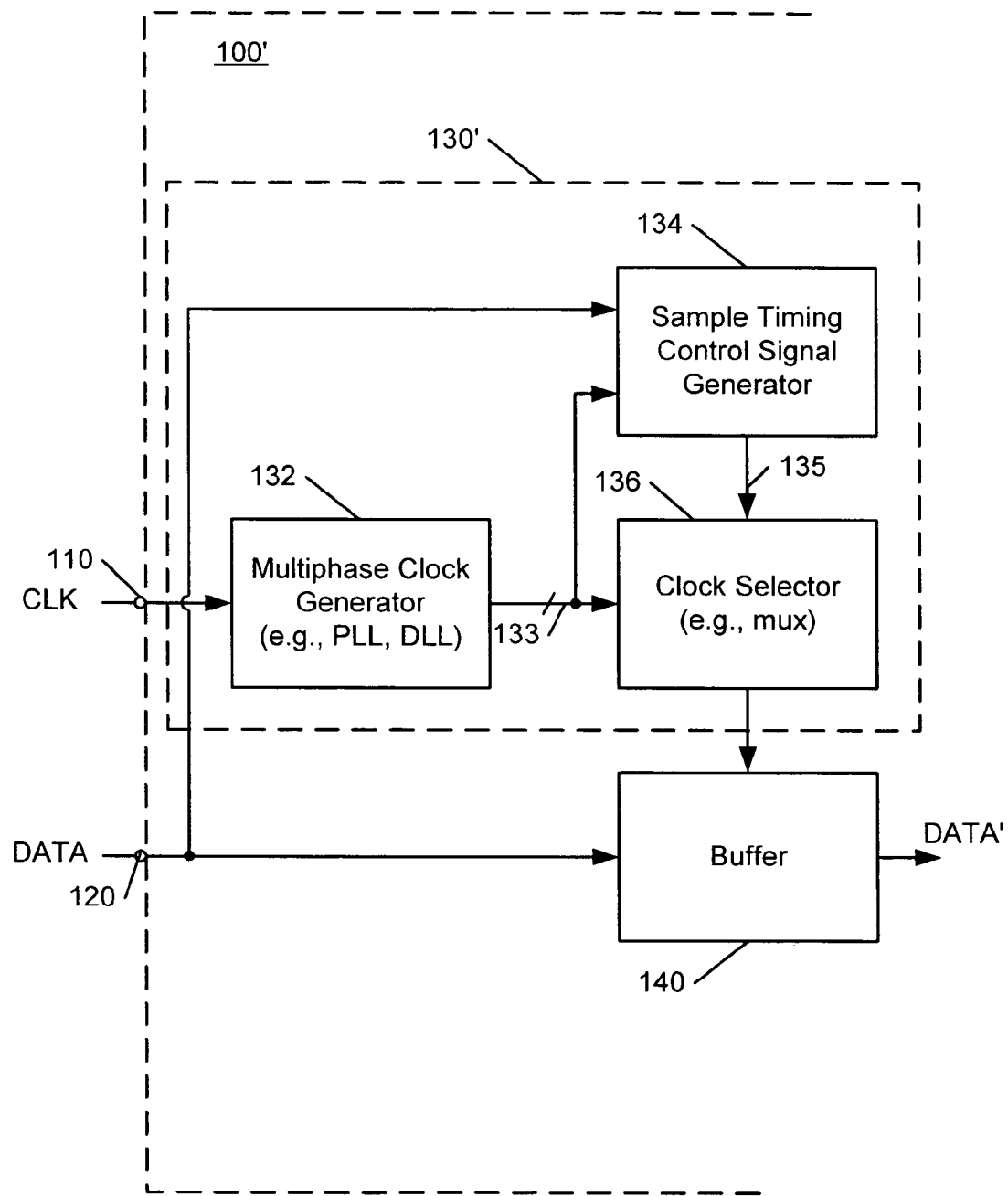
FIG. 2 is a schematic diagram illustrating a data output circuit utilizing a multiphase clock generator and clock selector according to further embodiments of the present invention.

According to further embodiments of the present invention, a statistical measure of data signal timing relative to its associated data clock signal may be generated by sampling the data signal using a plurality of phased clock signals generated from the data clock signal, generating a statistical measure of logic transitions of the data signal from the data signal samples, and selecting one of the phased clock signals to drive a buffer or other sampling circuit based on the statistical measure. Referring to FIG. 2, an integrated circuit device 100' according to further embodiments of the present invention includes clock and data inputs 110, 120 coupled to a sample timing circuit 130' and a buffer 140. The sample timing circuit 130' includes a multiphase clock generator 132 (e.g., a phased locked loop (PLL) or a delay locked loop (DLL)) that, responsive to the clock signal CLK at the clock input 110, generates a plurality of phased clock signals 133. The sample timing circuit 130' also includes a sample timing control signal generator 134 that receives the phased clock signals 133 and the data signal DATA at the data input 120. The sample timing control signal generator 134 samples the data signal DATA responsive to the phased clocked signals 133, generates a statistical measure of logic transitions in the data signal DATA from the signal samples, and responsively generates a clock selection signal 135. The sample timing circuit 130' further includes a clock selector 136 (e.g., a multiplexer (mux)) that applies a selected one of the phased clock signals 133 to a clock input of the buffer 140 responsive to the clock selection signal 135.

Figure 3:
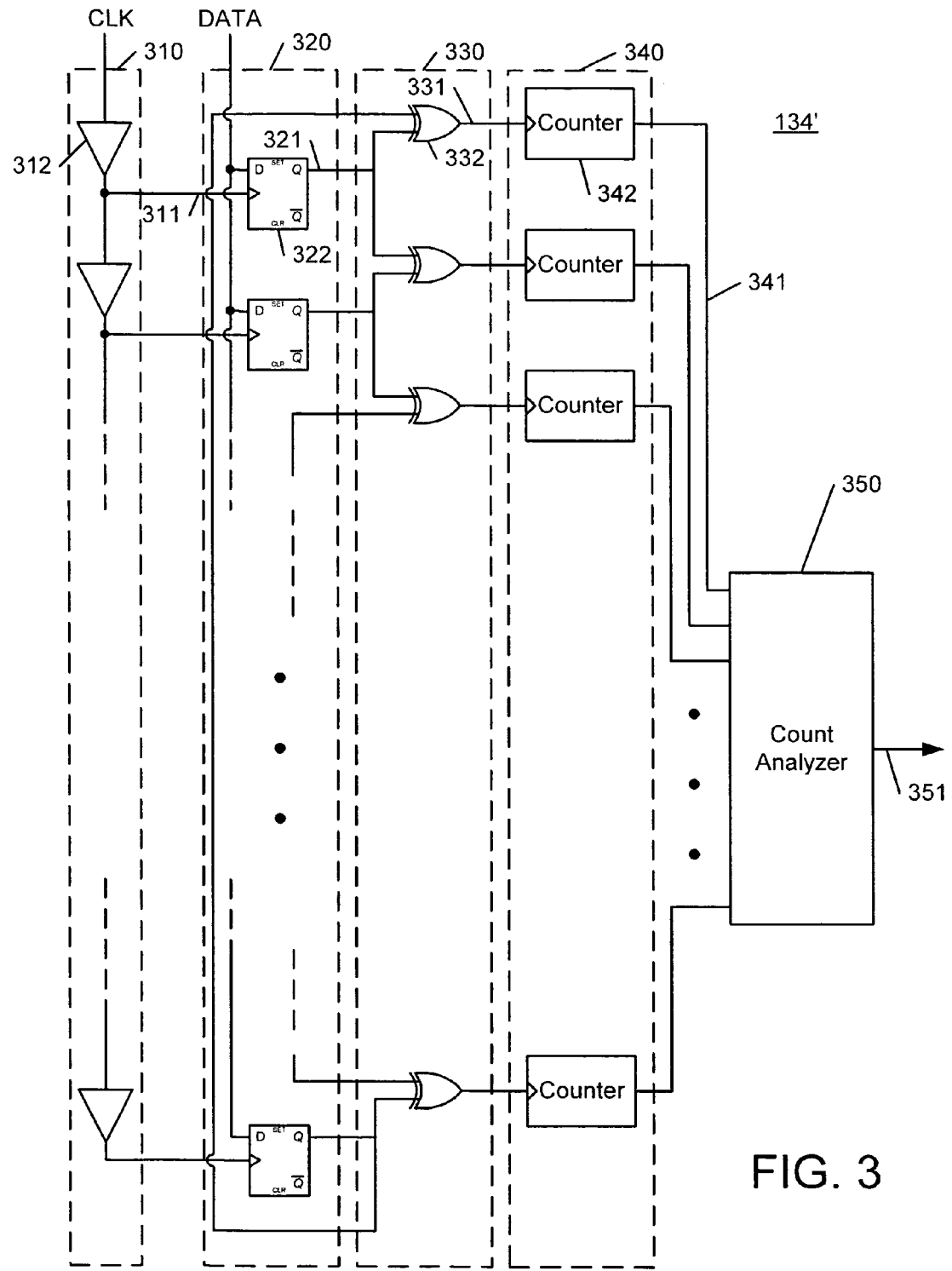
FIG. 3 is a schematic diagram illustrating a sample timing control signal generator using a tapped delay line according to still further embodiments of the present invention.

An exemplary implementation of a sample timing control signal generator 134' according to some embodiments of the present invention is shown in FIG. 3. The sample timing control signal generator 134' includes a tapped delay line 310 that generates a plurality of phased clock signals 311 from respective taps responsive to an input data clock signal CLK, which may be the clock signal CLK shown in FIGS. 1 and 2, or a derivative (e.g., a delayed version) thereof. As shown, the tapped delay line 310 includes a plurality of serially connected delays 312 that generate the respective phased clock signals 311. The delays 312 are configured such that relative delay between successive ones of the phased clock signals 311 is a fraction (e.g., 1/10) of the period of the clock signal CLK. It will be appreciate that the tapped delay line 310 may, for example, be included in a forward path of a PLL or a DLL.

The taps of the delay line 310 are coupled to clock inputs of a sampling circuit 320, which, due to the fractional phasing of the phased clock signals 311, oversamples (relative to the clock signal CLK) the data signal DATA. As shown, the sampling circuit 320 includes a plurality of latches 322, respective clock inputs of which are coupled to respective ones of the taps of the delay line 310. In FIG. 3, the latches 322 are shown as D flip-flops, but it will be appreciated that other sampling circuits may be used with the present invention.

Outputs of the data sampling circuit 320 are coupled to a transition detector 330. In the illustrated embodiments, the transition detector 330 includes a plurality of exclusive-OR (XOR) gates 332, respective ones of which receive samples of the data signal DATA at their inputs from data outputs of respective pairs of the latches 322 that are clocked by successive edges of the phased clock signals 311. The XOR gates 332 generate transition detection signals 331 responsive to the samples, i.e., an XOR gate 332 outputs a logic "1" when the successive data signal samples applied thereto have different logical values, indicative of a logic transition in the data signal DATA. It will be appreciated that, although FIG. 3 illustrates the use of XOR gates 332 to detect data signal transitions, equivalent functions may be provided by other logic circuits.

The transition detection signals 331 are provided to the clock inputs of a plurality of counters 342 of a transition statistics generator 340. Responsive to the transition detection signals 331, the counters 342 generate respective counts 341 that are representative of the relative frequency of transitions in the data signal corresponding to respective time periods that are defined by successive edges of the respective phased clock signals 311. A count analyzer 350 receives the counts 341 and analyzes the counts 341 to generate a clock selection signal 351. The clock selection signal 351 may be used, for example, to select one of the phased clock signals 311 to clock a data input buffer, in a manner similar to that described above with reference to FIG. 2.

Figure 4:
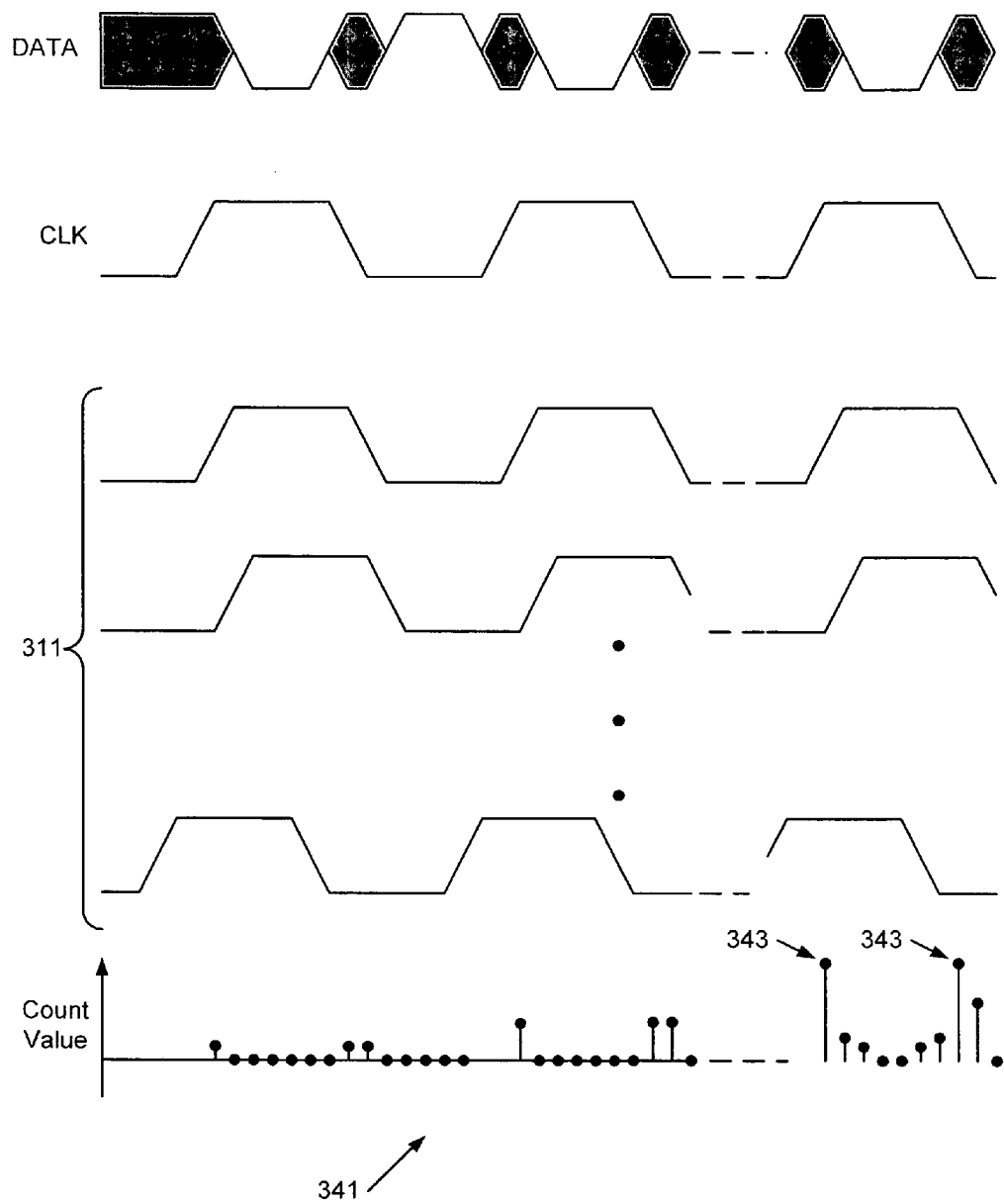
FIG. 4 is a timing diagram illustrating exemplary operations of the sample timing control signal generator of FIG. 3.

FIG. 4 is an idealized representation illustrating exemplary operations of the sample timing control signal generator 134' of FIG. 3. The phased clock signals 311 are used to sample the data signal DATA (shown as a double data rate (DDR) signal) over a plurality of cycles of the associated data clock signal CLK. As the sampling proceeds, the counters 342 develop counts 341 that, due to integration over multiple periods of the data clock signal CLK, exhibit an increasingly well-defined non-uniform distribution, i.e., effects of jitter and/or skew may have on the logic values of particular samples of the data signal DATA are effectively filtered as the counts 341 accumulate. From the counts 341, a desired sampling point, for example, a point between extrema in the counts 341, can be identified. After a predetermined accumulation period, which may be conditioned on, for example, the passage of a predetermined number of periods of the data clock signal CLK and/or a minimum value criterion for the counts 341, the count analyzer 350 may analyze the counts 341 to identify a desirable sampling point for the data signal DATA relative to the data clock signal CLK, i.e., a sampling point that is safely within a "data valid" window for the data signal DATA. After a desirable sample timing is identified, the counters 342 may be allowed to further accumulate and/or may be reset (to avoid overflow) to prepare for a subsequent determination of transition statistics.

For example, the count analyzer 350 may search the counts 341 to identify two extrema 343 (e.g., maximum counts), which would be expected to lie near the edges of the "data valid" window. The count analyzer 350 may then identify a midpoint between the extrema, and select one of the phased clock signals 311 that most closely corresponds to the identified midpoint. It will be appreciated that a sampling point other than a midpoint may be selected, depending on, for example, the data set up and hold time requirements of the sampling circuit for which sample timing is being determined. Analysis techniques other than extrema-based searching may also be used. The count analyzer 350 may be implemented using any of a number of different types of circuits, including, but not limited to, special-purpose programmable logic circuits and/or general-purpose data processing circuits. It will be understood that, generally, the functions of the tapped delay line 310, the sampling circuit 320, the transition detector 330, the transition statistics generator 340, and/or the count analyzer 350 may be integrated in one or more devices. For example, some or all of these functions may be implemented in a state machine implemented in a programmable logic circuit. It will be further understood that embodiments of the invention may use circuits having different arrangements of combinatorial and sequential logic elements than those described with reference to FIGS. 3 and 4, but having similar transition statistics-based functionality.

Figure 5:
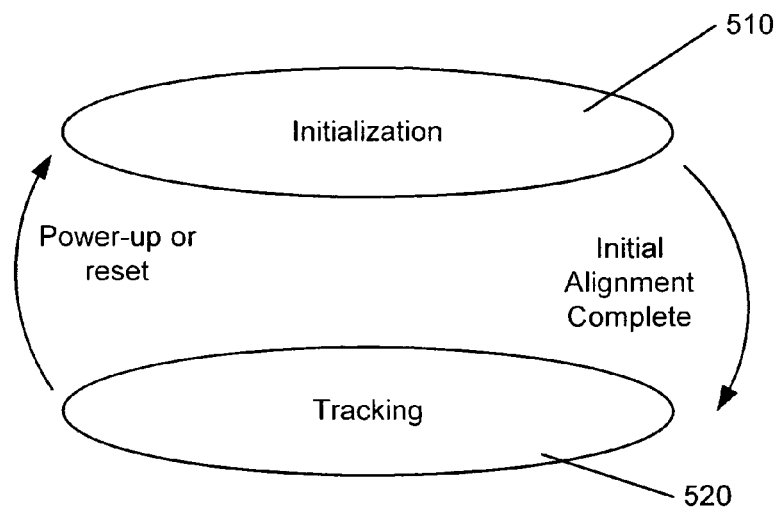
FIG. 5 is a state diagram illustrating state transitions of a data input circuit according to additional embodiments of the present invention.

According to further embodiments of the present invention, data sampling alignment may occur differently in different modes of operation of a device. As shown in FIG. 5, upon power up or other reset of the integrated circuit device, the sample timing circuit (e.g., the circuit 130 shown in FIG. 1) may transition to an initialization mode 510 in which an initial alignment is achieved. If the circuit architecture shown in FIG. 3 is used, for example, the initialization mode 510 may involve analyzing a reduced number of the counts 341, for example, counts associated with ones of the phased clock signals 311 that are near an a priori "expected" optimum sampling point. This may simplify and, therefore, speed up the search conducted by the count analyzer 350. After an initial alignment is achieved, the device may transition to a tracking mode 520, in which a greater number of the counts 341 may be analyzed while the device is acting on data sampled according to the initial alignment. Responsive to the counts generated during the tracking mode 520, the device may more accurately align the sampling point for the data signal using the increased search space. It will be appreciated that other functions in the initialization and tracking modes 510, 520 may also be different. For example, the tracking mode 520 may involve accumulating transition information over a greater time period than the initialization mode 510.

Figure 6:
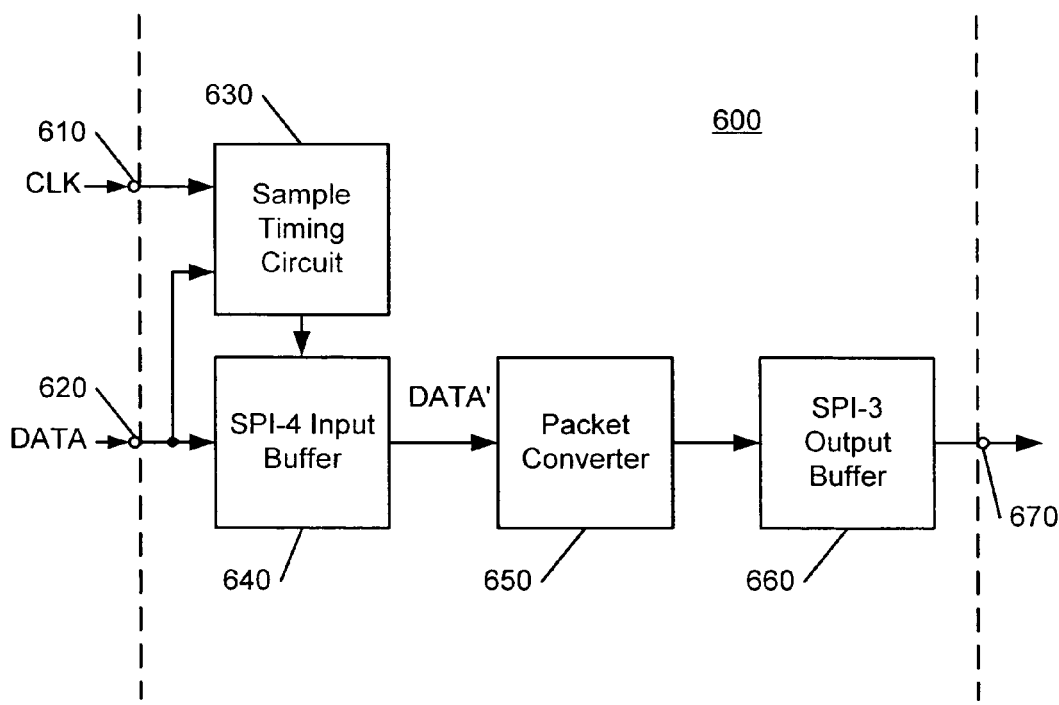
FIG. 6 is a schematic diagram illustrating a packet exchange device including a data input circuit according to further embodiments of the present invention.

FIG. 6 illustrates an exemplary application of a data input circuit according to further embodiments of the present invention. In particular, FIG. 6 illustrates portions of a packet exchange device 600 that provides packet transport between a relatively high speed (e.g., greater than 300 MHz) double data rate (DDR) System Packet Interface (SPI)-4 bus, which may be particularly vulnerable to data skew and/or jitter, and a slower SPI-3 bus. As shown, the device 600 includes a SPI-4 input buffer 640 that samples a data signal DATA at a data input port 620 using a sample timing determined by a sample timing circuit 630. The sample timing circuit 630 controls the input buffer 640 responsive to the data signal DATA and an associated data clock signal CLK received at a clock input 610 of the device using statistics-based techniques along the lines discussed above. The data DATA' captured by the SPI-4 input buffer 640 is passed to a packet converter 650, which manages data flow and format for external transmission at a data output port 670 via an SPI-3 data output buffer 660. It will be appreciated that the embodiments of FIG. 6 are provided for purposes of illustrating an exemplary application of the present invention, and that the present invention may be used with a wide variety of devices that receive data signals, such as data processor devices, memory devices, and the like. It will be further understood that embodiments of the invention may be used with a variety of different data input formats, including single and double data rate formats.

In the drawings and specification, there have been disclosed exemplary embodiments of the invention and, although specific terms are employed, they are used in a generic and descriptive sense only and not for purposes of limitation, the scope of the invention being set forth in the following claims.

What is claimed is:
1. An integrated circuit device comprising:
a data input configured to receive a data signal;
a clock input configured to receive a clock signal associated with the data signal; and
a sample timing circuit coupled to the clock input and the data input, the sample timing circuit comprising:
a multiphase clock generator configured to generate a plurality of phased clock signals responsive to the clock signal;
a plurality of latches, respective ones of which are configured to store samples of the data signal responsive to respective ones of the phased clock signals;
a plurality of transition detectors, respective ones of which receive respective pairs of the stored samples corresponding to respective pairs of consecutive edges of the phased clock signals and responsively generate respective transition indication signals;
a plurality of counters that generate respective counts over a plurality of periods of the data signal responsive to respective ones of the transition indication signals;
a count analyzer that generates a sample timing control signal responsive to the counts; and
a data input circuit configured to sample the data signal responsive to the sample timing control signal,
wherein the count analyzer considers transition information from a first number of the plurality of latches to generate the sample timing control signal in a first mode of operation, and wherein the count analyzer considers information from a second number of the plurality of latches to generate the sample timing control signal in a second mode of operation.
2. A device according to claim 1, wherein the first mode of operation comprises an initialization mode, wherein the second mode of operation comprises a tracking mode, and wherein the first number is less than the second number.

* * * * *